(12) United States Patent
Otsubo et al.

(10) Patent No.: US 12,389,528 B2
(45) Date of Patent: Aug. 12, 2025

(54) MODULE

(71) Applicant: Murata Manufacturing Co., Ltd., Kyoto-fu (JP)

(72) Inventors: Yoshihito Otsubo, Nagaokakyo (JP); Minoru Hatase, Nagaokakyo (JP)

(73) Assignee: MURATA MANUFACTURING CO., LTD., Kyoto-fu (JP)

( * ) Notice: Subject to any disclaimer, the term of this patent is extended or adjusted under 35 U.S.C. 154(b) by 211 days.

(21) Appl. No.: 18/062,652

(22) Filed: Dec. 7, 2022

(65) Prior Publication Data

US 2023/0107390 A1  Apr. 6, 2023

Related U.S. Application Data

(63) Continuation of application No. PCT/JP2021/017895, filed on May 11, 2021.

(30) Foreign Application Priority Data

Jun. 10, 2020  (JP) ................. 2020-101186

(51) Int. Cl.
*H05K 1/02* (2006.01)
*H05K 1/11* (2006.01)
*H05K 1/18* (2006.01)

(52) U.S. Cl.
CPC ............ *H05K 1/0216* (2013.01); *H05K 1/11* (2013.01); *H05K 1/182* (2013.01); *H05K 2201/10522* (2013.01)

(58) Field of Classification Search
CPC ...... H05K 1/0218; H05K 1/0216; H05K 1/11; H05K 1/182; H05K 1/0298; H05K 1/181; H05K 2201/0715; H05K 2201/10522; H05K 9/0024; H01L 2924/3025; H01L 25/0652; H01L 25/0655; H01L 25/16; H01L 21/561; H01L 23/3121; H01L 23/552

See application file for complete search history.

(56) References Cited

U.S. PATENT DOCUMENTS

2010/0207264 A1  8/2010  Ono
2011/0006106 A1  1/2011  Kanryo et al.
(Continued)

FOREIGN PATENT DOCUMENTS

JP  4530110 B2  8/2010
JP  2010-192653 A  9/2010
(Continued)

OTHER PUBLICATIONS

International Search Report for PCT/JP2021/017895 dated Jul. 20, 2021.

*Primary Examiner* — Roshn K Varghese
(74) *Attorney, Agent, or Firm* — McDonald Hopkins LLC

(57) ABSTRACT

The module includes a substrate, a first component mounted on a first surface, a first sealing resin, and a first shield film. When viewed in a cross section taken along a plane perpendicular to the first surface, the substrate is formed with a step portion. The substrate includes a first extraction electrode disposed to be exposed to the step portion. The first extraction electrode is connected to a first shield film. The first shield film includes one or more thick portions having a film thickness greater than that of the other portions in the step portion.

10 Claims, 14 Drawing Sheets

(56) References Cited

U.S. PATENT DOCUMENTS

| | | | |
|---|---|---|---|
| 2011/0229708 A1 | 9/2011 | Asami et al. | |
| 2012/0168214 A1* | 7/2012 | Kashiwagi | H01L 24/97 |
| | | | 174/257 |
| 2013/0294034 A1 | 11/2013 | Kanryo et al. | |
| 2015/0296667 A1 | 10/2015 | Hirose et al. | |
| 2017/0141081 A1* | 5/2017 | Lee | H01L 25/0657 |
| 2017/0221835 A1* | 8/2017 | Yoo | H01L 25/0652 |
| 2017/0323838 A1* | 11/2017 | Otsubo | H01L 24/97 |
| 2018/0286816 A1* | 10/2018 | Kitazaki | H01L 23/3121 |
| 2021/0043585 A1 | 2/2021 | Nomura et al. | |
| 2021/0204395 A1 | 7/2021 | Yamamoto et al. | |

FOREIGN PATENT DOCUMENTS

| | | |
|---|---|---|
| JP | 2011-216849 A | 10/2011 |
| JP | 2015-204342 A | 11/2015 |
| WO | 2012/093690 A1 | 7/2012 |
| WO | 2019/216300 A1 | 11/2019 |
| WO | 2020/067468 A1 | 4/2020 |

* cited by examiner

MODULE

CROSS REFERENCE TO RELATED APPLICATION

This is a continuation of International Application No. PCT/JP2021/017895 filed on May 11, 2021 which claims priority from Japanese Patent Application No. 2020-101186 filed on Jun. 10, 2020. The contents of these applications are incorporated herein by reference in their entireties.

BACKGROUND OF THE DISCLOSURE

Field of the Disclosure

The present disclosure relates to a module.

Description of the Related Art

Japanese Patent No. 4530110 (PTL 1) describes an example method of manufacturing a module. In PTL 1, in order to manufacture a plurality of modules, after mounting components on a surface of an aggregate substrate which corresponds to the plurality of modules and forming a sealing resin layer, the aggregate substrate is diced into individual products. At this time, the aggregate substrate is not completely cut to the entire thickness but only to a halfway of the entire thickness. In this state, a shield film is formed, and then the aggregate substrate is completely cut into individual modules.

PTL 1: Japanese Patent No. 4530110

BRIEF SUMMARY OF THE DISCLOSURE

In the manufacturing method described in PTL 1, by cutting the substrate to a halfway of the entire thickness to expose a ground electrode and connect the ground electrode to a shield film to be provided later, it is possible to ensure the shielding performance of the module. Further, a step portion is formed to surround the outer periphery of the module, and the shield film is formed to cover the step portion. The ground electrode configured to ground the shield film may be exposed in the vicinity of the step portion. When the side surfaces of the sealing resin layer and the substrate are perpendicular to each other, the shield film formed by sputtering tends to become thinner downward, which may make the connection between the ground electrode exposed to the side surface of the substrate and the shield film insufficient.

Accordingly, an object of the present disclosure is to provide a module having a sufficiently stable electrical connection between a ground electrode and a shield film.

In order to achieve the object mentioned above, a module according to the present disclosure includes: a substrate having a first surface; a first component mounted on the first surface; a first sealing resin disposed to cover the first surface and the first component; and a first shield film that covers at least a part of an upper surface and a side surface of the first sealing resin and a side surface of the substrate. When viewed in a cross section taken along a plane perpendicular to the first surface, the substrate is formed with a step portion. The substrate includes a first extraction electrode disposed to be exposed to the step portion. The first extraction electrode is connected to the first shield film. The first shield film includes one or more thick portions having a film thickness greater than that of the other portions in the step portion.

According to the present disclosure, since a step portion is provided in the substrate, the first extraction electrode is disposed to be exposed to the step portion, and the first shield film includes a thick portion in the step portion, it is possible to make the electrical connection between the extraction electrode and the shield film sufficiently stable.

DETAILED DESCRIPTION OF THE DISCLOSURE

Figure 1:
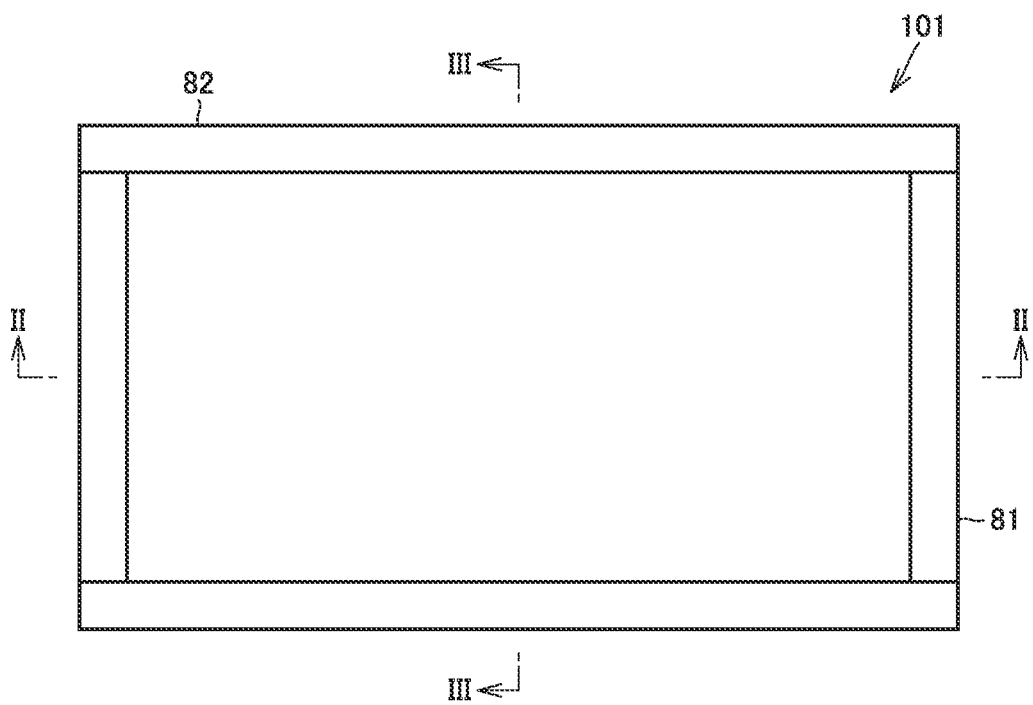
FIG. 1 is a planar view illustrating a module according to a first embodiment of the present disclosure.

Components in the drawings may not be drawn to scale, and may be exaggerated for the convenience of explanation. In the following description, when an upper position or a lower position is mentioned, it does not necessarily mean an absolutely upper or lower position, and it may mean a relatively upper or lower position in the illustrated posture.

First Embodiment

Figure 2:
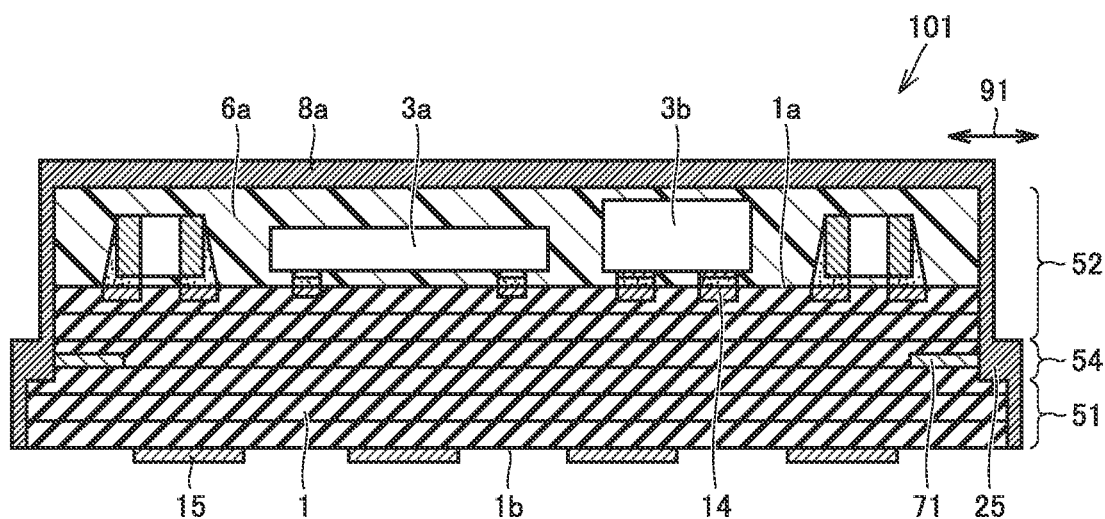
FIG. 2 is a cross-sectional view taken along a line II-II in FIG. 1.
Figure 3:
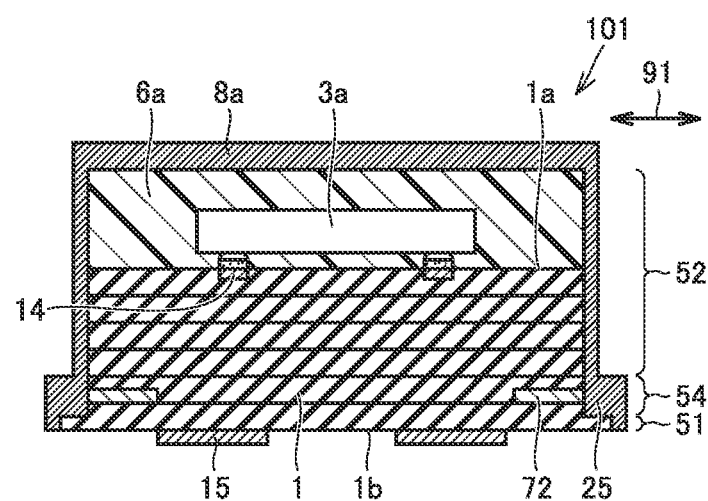
FIG. 3 is a cross-sectional view taken along a line III-III in FIG. 1.

A module according to a first embodiment of the present disclosure will be described with reference to FIGS. 1 to 3. FIG. 1 is a planar view illustrating a module 101 according to the present embodiment. In FIG. 1, the right side is a first side 81, and the upper side is a second side 82. FIG. 2 is a cross-sectional view taken along a line II-II in FIG. 1. FIG. 3 is a cross-sectional view taken along a line III-III in FIG. 1.

The module 101 includes a substrate 1 having a first surface 1a, a component 3a mounted on the first surface 1a as a first component, a first sealing resin 6a disposed to cover the first surface 1a and the component 3a, and a first shield film 8a that covers at least a part of an upper surface and a side surface of the first sealing resin 6a and a side surface of the substrate 1. In the present embodiment, the first shield film 8a covers the entire side surface of the substrate 1. In addition to the component 3a, another component may be mounted on the first surface 1a. For example, a component 3b may be mounted on the first surface 1a. In the present embodiment, it is assumed that the component 3a is a first component. In the drawings, all the mounted components are not necessarily denoted by reference numerals.

The substrate 1 has a second surface 1b opposite to the first surface 1a. A pad electrode 15 is disposed on the second surface 1b. The pad electrode 15 functions as an external connection terminal and is used when the module 101 is mounted on a mother substrate or the like. A pad electrode 14 is disposed on the first surface 1a, and the component 3a and the like are electrically connected to the substrate 1 using the pad electrode 14.

When viewed in a cross section taken along a plane perpendicular to the first surface 1a, in other words, when viewed in FIG. 2 or 3, the substrate 1 is formed with a step portion 54. A side surface of a portion where the first sealing resin 6a and the substrate 1 are joined together includes a first portion 51 which serves as a part of the side surface of the substrate 1, a second portion 52 which includes the side surface of the first sealing resin 6a and is located at a position receded from the first portion 51, and a step portion 54 which is located between the first portion 51 and the second portion 52 and at which the side surface of the substrate 1 is perpendicular to the first surface 1a. As illustrated in FIG. 2, the substrate 1 includes a first extraction electrode 71 disposed to be exposed to the step portion 54. The first extraction electrode 71 is connected to the first shield film 8a. In the step portion 54, the first shield film 8a includes one or more thick portions 25, the thickness of which is locally greater in a direction parallel to the first surface 1a, i.e., in a direction along an arrow 91. In other words, the film thickness of the first shield film 8a in the step portion 54 is greater than that of the other portions. The "film thickness" of the first shield film 8a in the thick portion refers to a thickness in a direction parallel to the first surface 1a, i.e., in a direction along the arrow 91. The film thickness of the first shield film 8a in the thick portion is preferably 1.5 times or more as large as the film thickness of the first shield film 8a in any portion other than the thick portion. In the example illustrated in the present embodiment, each of the first side 81 and the second side 82 independently includes a combination of the first portion 51, the second portion 52, and the step portion 54.

The substrate 1 includes a first extraction electrode 71 (see FIG. 2) disposed to be exposed to the step portion 54 at the first side 81, and a second extraction electrode 72 (see FIG. 3) disposed to be exposed to the step portion 54 at the second side 82. The first extraction electrode 71 and the second extraction electrode 72 are connected to the first shield film 8a, respectively. In the present embodiment, the position of the second extraction electrode 72 in a height direction is different from the position of the first extraction electrode 71 in the height direction, but this is merely an example. The position of the second extraction electrode 72 in the height direction may be the same as the position of the first extraction electrode 71 in the height direction.

In the present embodiment, since the first extraction electrode 71 is disposed to be exposed to the step portion 54, and the first shield film 8a includes the thick portion 25 in the step portion 54, it is possible to make the electrical connection between the extraction electrode and the shield film sufficiently stable.

As described in the present embodiment, the module 101 preferably has the following configuration. The substrate 1 has the first side 81 and the second side 82, and the first extraction electrode 71 is disposed to be exposed to the step portion 54 at the first side 81. Further, the substrate 1 includes the second extraction electrode 72 disposed to be exposed to the step portion 54 at the second side 82. The position of the second extraction electrode 72 in the height direction is different from the position of the first extraction electrode 71 in the height direction. The first extraction electrode, the second extraction electrode and the first shield film are connected to a ground potential.

(Manufacturing Method)

Figure 4:
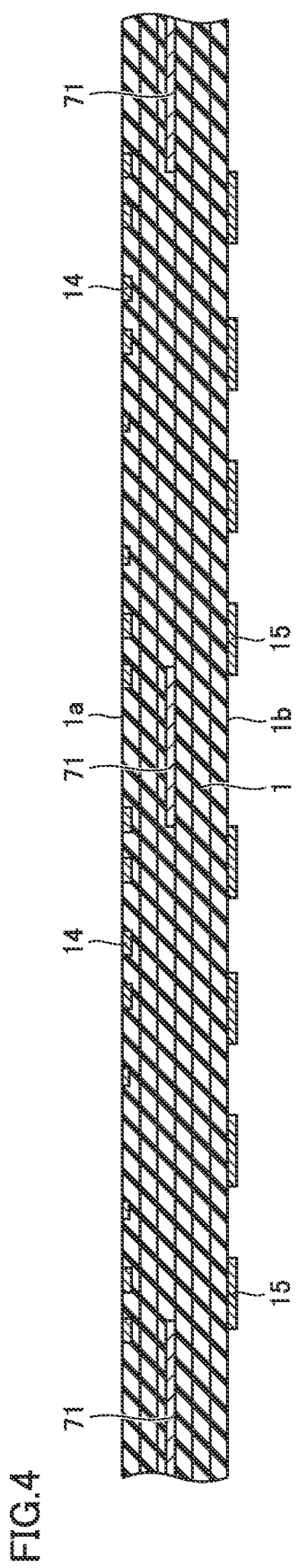
FIG. 4 is an explanatory view illustrating a first step of a method of manufacturing the module according to the first embodiment of the present disclosure.

A method of manufacturing the module 101 will be described with reference to FIGS. 4 to 9. First, as illustrated in FIG. 4, a substrate 1 is prepared. In the present embodiment, the substrate 1 is an aggregate substrate. In other words, the substrate 1 has a large area corresponding to a plurality of modules 101. The substrate 1 has a first surface 1a and a second surface 1b. A pad electrode 14 is disposed on the first surface 1a. A pad electrode 15 is disposed on the second surface 1b.

Figure 5:
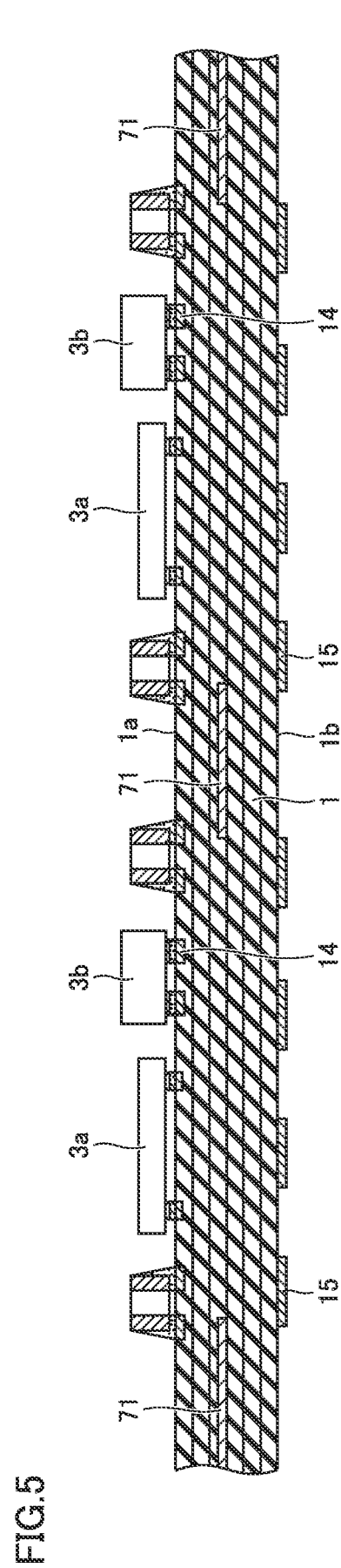
FIG. 5 is an explanatory view illustrating a second step of the method of manufacturing the module according to the first embodiment of the present disclosure.
Figure 6:
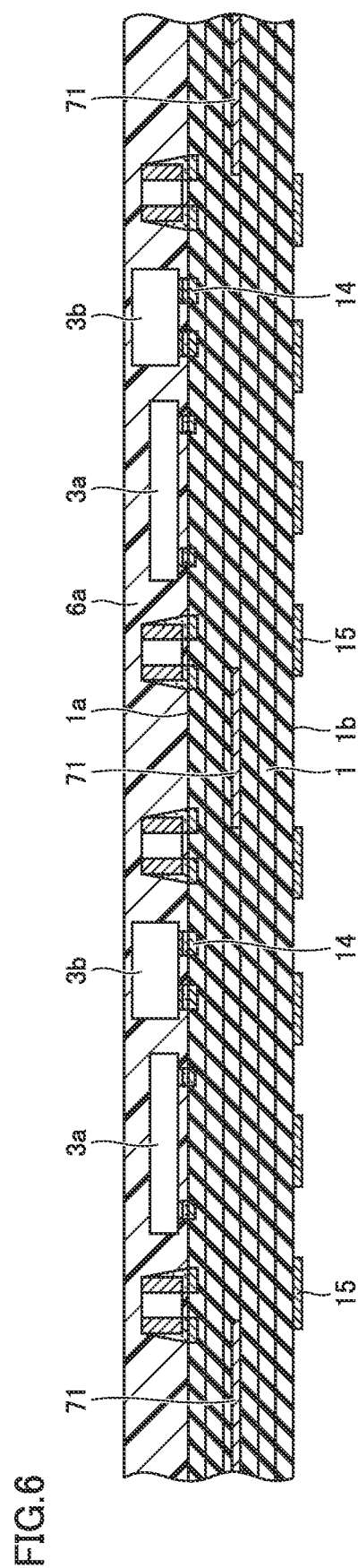
FIG. 6 is an explanatory view illustrating a third step of the method of manufacturing the module according to the first embodiment of the present disclosure.

As illustrated in FIG. 5, components are mounted on the first surface 1a. In the present embodiment, components 3a, 3b and the like are mounted on the first surface 1a. Next, as illustrated in FIG. 6, a first sealing resin 6a is disposed. The first sealing resin 6a may be formed by molding.

Figure 7:
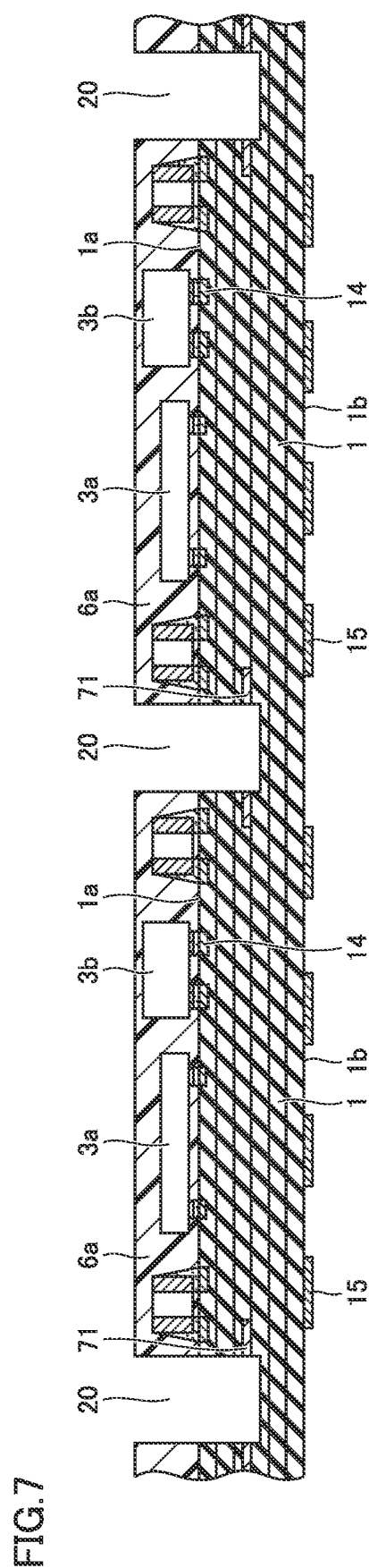
FIG. 7 is an explanatory view illustrating a fourth step of the method of manufacturing the module according to the first embodiment of the present disclosure.

As illustrated in FIG. 7, a trench 20 is formed along the boundaries of each module. The trench 20 may be formed by using a dicing machine. The trench 20 is formed to completely split the first sealing resin 6a but cut into the substrate 1 halfway in the thickness direction. Forming a trench 20 in this manner is also referred to as "half cutting". In the present embodiment, the trench 20 is formed to expose the extraction electrode in the substrate 1 to the portion exposed by dicing.

Figure 8:
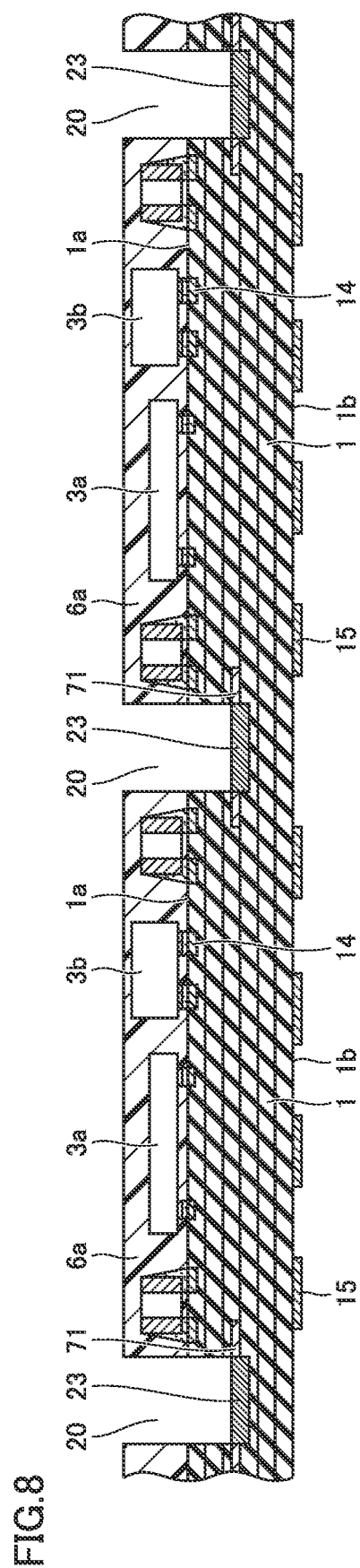
FIG. 8 is an explanatory view illustrating a fifth step of the method of manufacturing the module according to the first embodiment of the present disclosure.

As illustrated in FIG. 8, a plating film 23 is grown on the bottom of the trench 20.

Figure 9:
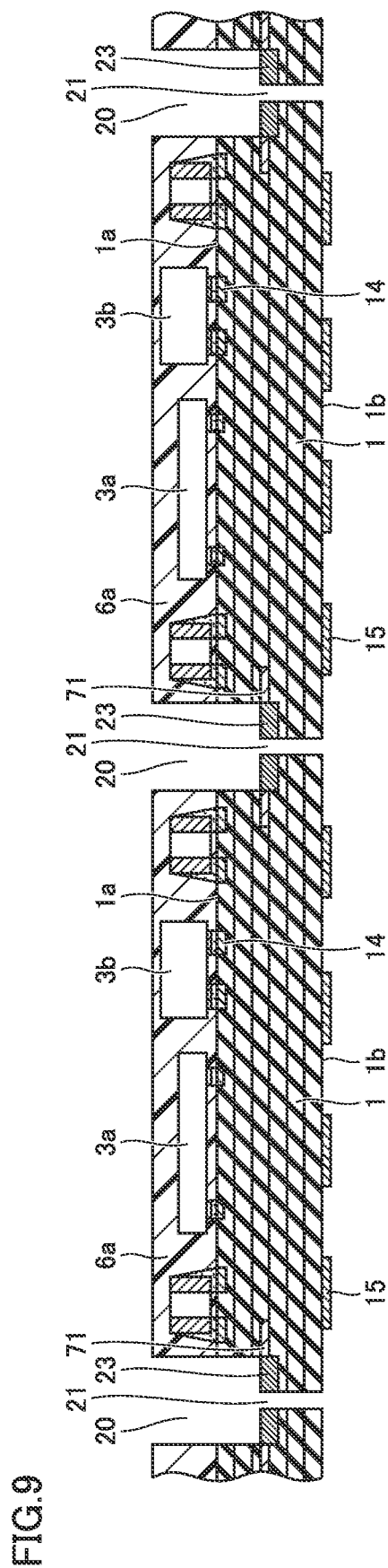
FIG. 9 is an explanatory view illustrating a sixth step of the method of manufacturing the module according to the first embodiment of the present disclosure.

As illustrated in FIG. 9, the aggregate substrate is cut into individual modules by using a dicing machine. In other words, cuts 21 are formed. Each cut 21 is formed to pass through the center of the trench 20. The blade used in forming each cut 21 is thinner than the blade used in forming each trench 20. The plating film 23 is also divided while the cut 21 is being formed. A sputtering process is performed on the individual module cut in this manner so as to form a sputtering film that covers the upper surface and the side surface of the first sealing resin 6a, the side surface of the substrate 1, and the upper surface and the side surface of the plating film 23. Thus, as illustrated in FIG. 2, the first shield film 8a is formed. The divided plated film 23 illustrated in FIG. 9 is integrated with the sputtering film and becomes a part of the first shield film 8a in FIG. 2. Since the divided plating film 23 is present at the step portion, the thickness of the first shield film 8a in the direction along the arrow 91 is locally greater. In other words, this portion becomes the thick portion 25. Thus, the module 101 illustrated in FIGS. 1 to 3 can be obtained.

Although a plating film is used to form a thick portion in the present embodiment, in consideration of the fact that the film thickness of the first shield film 8a in the thick portion is preferably 1.5 times or more the film thickness of the first shield film 8a in the other portions as described above, the thick portion may be formed by sputtering. Even when the sputtering is used, since the step portion is present, the thick portion may be formed accordingly.

Second Embodiment

Figure 10:
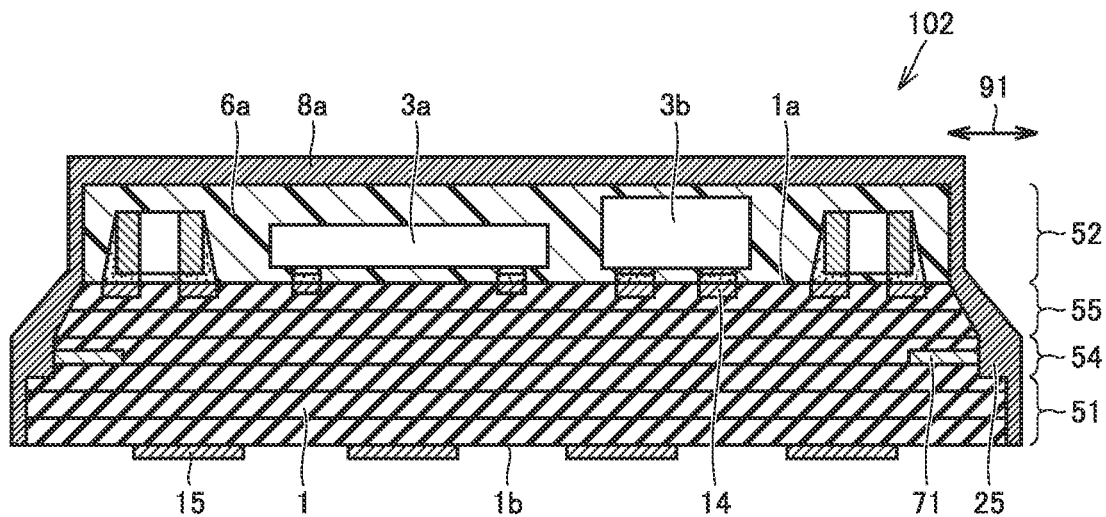
FIG. 10 is a sectional view illustrating a module according to a second embodiment of the present disclosure.

A module according to a second embodiment of the present disclosure will be described with reference to FIG. 10. FIG. 10 is a cross-sectional view illustrating a module 102 according to the present embodiment. The module 102 is basically the same as the module 101 described in the first embodiment except the following configuration.

In the module 102, when viewed in a cross section taken along a plane perpendicular to the first surface 1a, the side surface of a portion where the first sealing resin 6a and the substrate 1 are joined together includes an inclined portion 55 where the side surface of the substrate 1 is inclined between the step portion 54 and the first surface 1a.

Also in the present embodiment, the same effect as that described in the first embodiment may be obtained.

Third Embodiment

Figure 11:
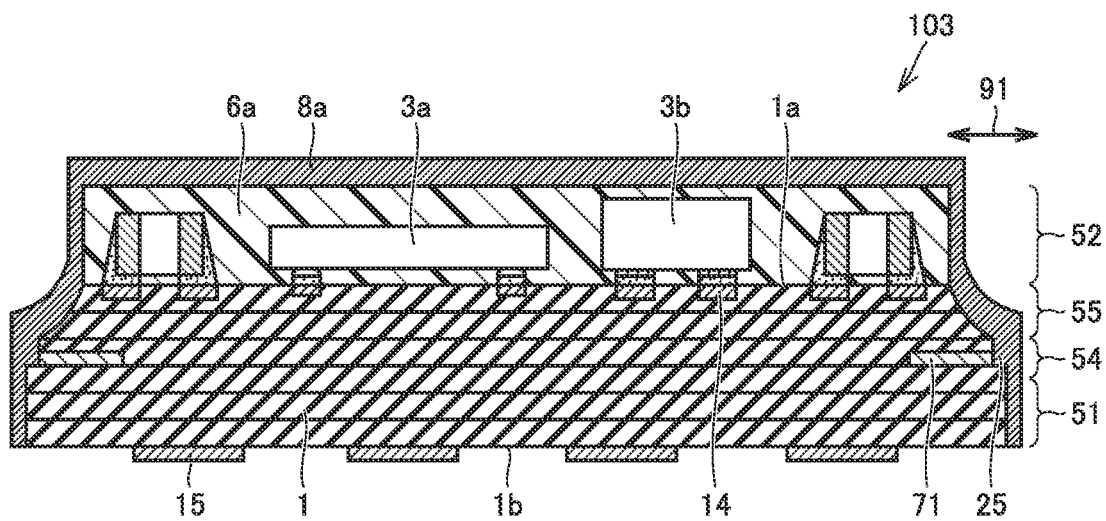
FIG. 11 is a sectional view illustrating a module according to a third embodiment of the present disclosure.

A module according to a third embodiment of the present disclosure will be described with reference to FIG. 11. FIG. 11 is a cross-sectional view illustrating a module 103 according to the present embodiment. The module 103 is basically the same as the module 102 described in the second embodiment except the following configuration.

In the module 102, the surface of the inclined portion 55 is a flat surface, but in the module 103 according to the present embodiment, the surface of the inclined portion 55 is a curved surface. In the cross-sectional view as illustrated in FIG. 11, the surface of the inclined portion 55 is a circular surface.

Also in the present embodiment, the same effect as that described in the second embodiment may be obtained.

Fourth Embodiment

Figure 12:
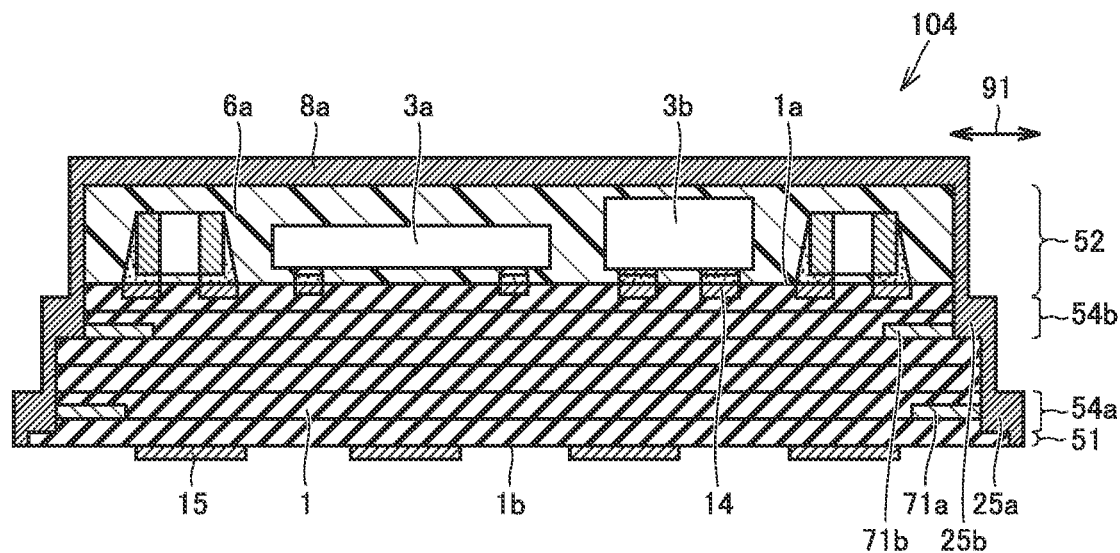
FIG. 12 is a first cross-sectional view illustrating a module according to a fourth embodiment of the present disclosure.
Figure 13:
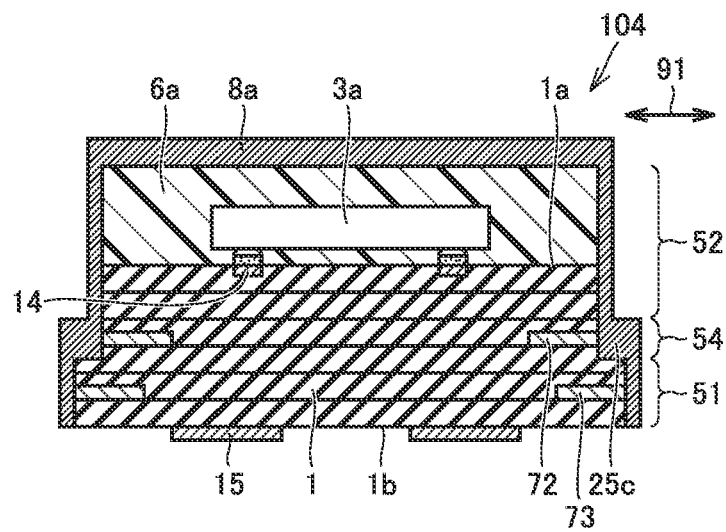
FIG. 13 is a second cross-sectional view illustrating the module according to the fourth embodiment of the present disclosure.

A module according to a fourth embodiment of the present disclosure will be described with reference to FIGS. 12 and 13. FIG. 12 is a cross-sectional view illustrating a module 104 according to the present embodiment. FIG. 13 is a cross-sectional view illustrating the module 104 taken along a plane different from that of FIG. 12 by an orientation angle of 90°. The module 104 is basically the same as the module 101 described in the first embodiment except the following configuration.

In the present embodiment, the substrate 1 has a plurality of step portions. In other words, the substrate 1 is formed with a first step portion 54a and a second step portion 54b. Each step portion has a thick portion. In the example illustrated in FIG. 12, the first step portion 54a is provided with a thick portion 25a, and the second step portion 54b is provided with a thick portion 25b. In the present embodiment, first extraction electrodes 71a and 71b are disposed to be exposed to the side surface of the substrate 1. The thick portion 25a is provided at a location to which the first extraction electrode 71a is exposed. The thick portion 25b is provided at a location to which the first extraction electrode 71b is exposed.

As illustrated in FIG. 13, a thick portion 25c is provided so as to correspond to the second extraction electrode 72. It is apparent from the comparison of FIGS. 12 and 13 that the number of thick portions may vary on different sides in a planar view. This is merely an example. The number of thick portions may be the same in each side in a planar view.

Also in the present embodiment, the same effect as that described in the first embodiment may be obtained. In the present embodiment, since the thick portions 25a and 25b are provided so as to correspond to each of the first extraction electrodes 71a and 71b, it is possible to make the electrical connection between each of the first extraction electrodes and the shield film sufficiently stable.

Fifth Embodiment

Figure 14:
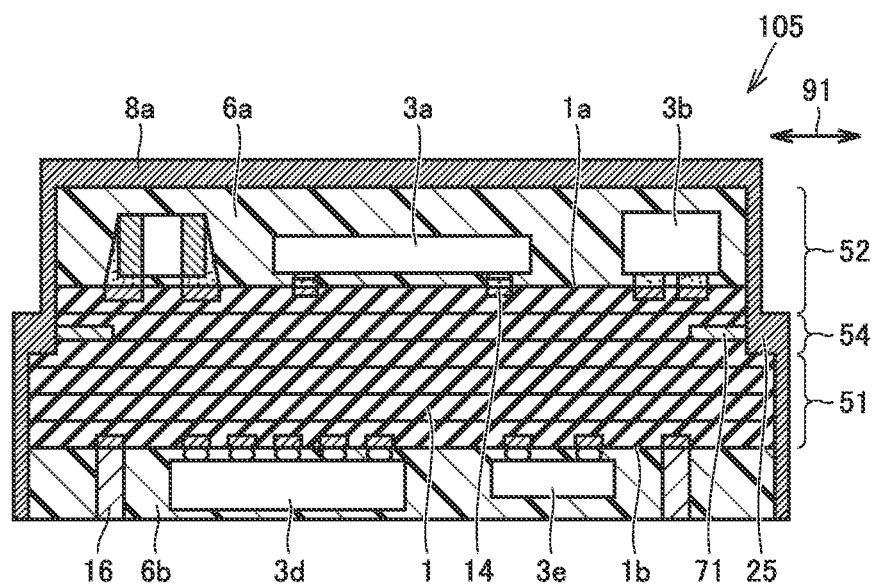
FIG. 14 is a first cross-sectional view illustrating a module according to a fifth embodiment of the present disclosure.
Figure 15:
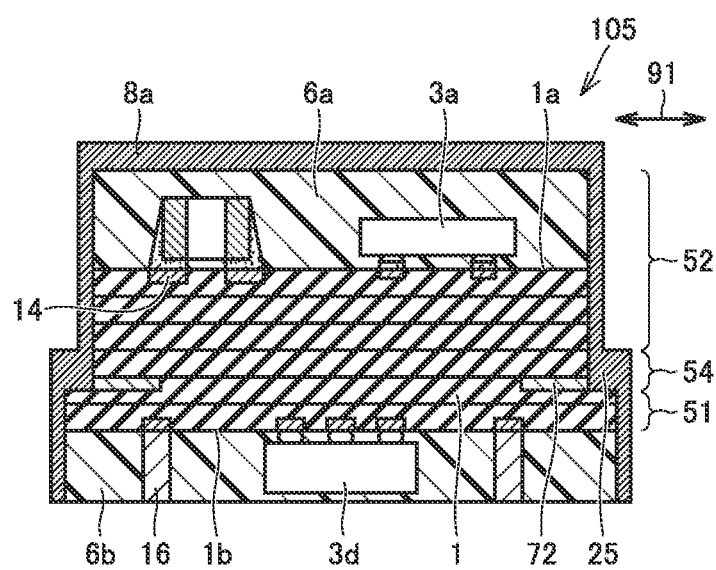
FIG. 15 is a second cross-sectional view illustrating the module according to the fifth embodiment of the present disclosure.

A module according to a fifth embodiment of the present disclosure will be described with reference to FIGS. 14 and 15. FIG. 14 is a cross-sectional view illustrating a module 105 according to the present embodiment. FIG. 15 is a cross-sectional view illustrating the module 105 taken along a plane different from that of FIG. 14 by an orientation angle of 90°. The module 105 is basically the same as the module 101 described in the first embodiment except the following configuration.

In the module 105, the substrate 1 has a second surface 1b facing opposite to the first surface 1a. The module 105 includes a second sealing resin 6b disposed to cover the second surface 1b. The first shield film 8a extends to cover a side surface of the second sealing resin 6b. The second surface 1b is mounted with, for example, components 3d and 3e. The components 3d and 3e are sealed by the second sealing resin 6b. In the present embodiment, the components 3d and 3e are completely covered with the second sealing resin 6b, but a part of the components 3d and 3e may be exposed from the second sealing resin 6b. The second surface 1b is provided with a columnar electrode 16. The columnar electrode 16 penetrates the second sealing resin 6b. The end surface of the columnar electrode 16 on the side farther from the substrate 1 is exposed to the outside. Alternatively, the end surface of the columnar electrode 16 on the side farther from the substrate 1 may be covered with a conductive film. The end of the columnar electrode 16 on the side farther from the substrate 1 serves as an external electrode when the module 105 is mounted on the mother substrate or the like. The module 105 has a so-called double-sided mounting structure.

Also in the present embodiment, the same effect as that described in the first embodiment may be obtained. In the present embodiment, since the double-sided mounting structure is employed, more components can be mounted on a limited area of the substrate 1.

Sixth Embodiment

Figure 16:
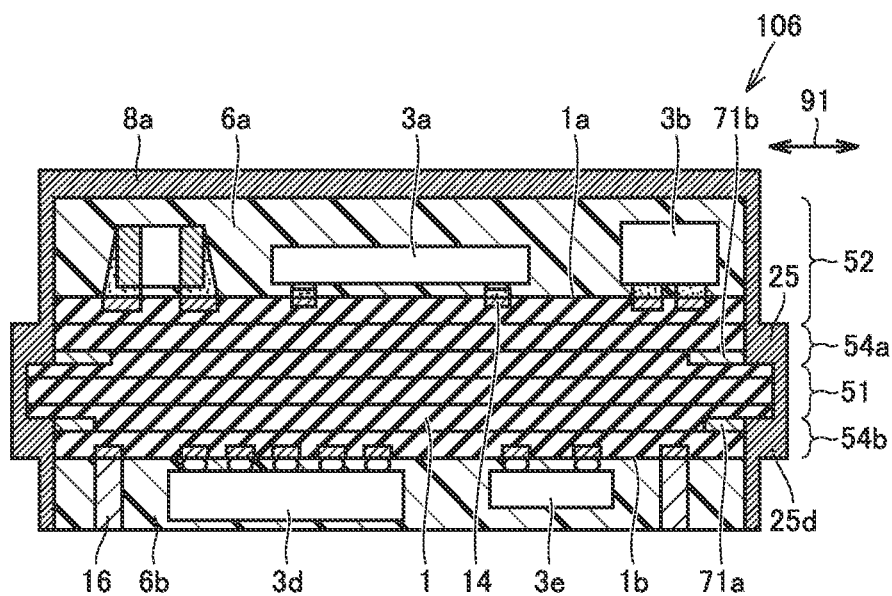
FIG. 16 is a first cross-sectional view illustrating a module according to a sixth embodiment of the present disclosure.
Figure 17:
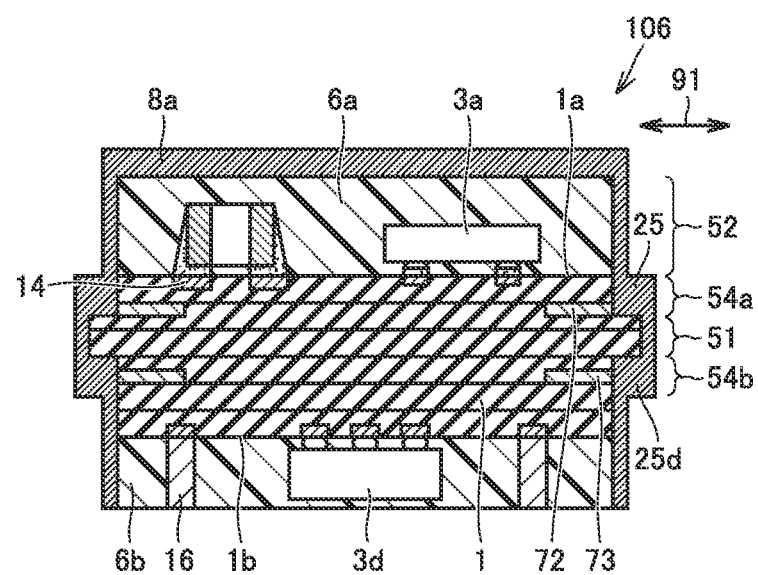
FIG. 17 is a second cross-sectional view illustrating the module according to the sixth embodiment of the present disclosure.

A module according to a sixth embodiment of the present disclosure will be described with reference to FIGS. 16 and 17. FIG. 16 is a cross-sectional view illustrating a module 106 according to the present embodiment. FIG. 17 is a cross-sectional view illustrating the module 106 taken along a plane different from that of FIG. 16 by an orientation angle of 90°. The module 106 is basically the same as the module 105 described in the fifth embodiment except the following configuration.

The module 106 includes a thick portion 25d having a structure which is mirror-symmetrical to the structure of the thick portion 25 in the vertical direction. In the present embodiment, first extraction electrodes 71a and 71b are disposed. The thick portion 25 is provided at a location where the first extraction electrode 71a is exposed to the side surface of the substrate 1, and the thick portion 25d is provided at a location where the first extraction electrode 71b is exposed to the side surface of the substrate 1.

In other words, when viewed in a cross section taken along a plane perpendicular to the first surface 1a, the substrate 1 is provided with the first step portion 54a on the first surface 1a side and the second step portion 54b on the second surface 1b side. The first shield film 8a covers the first step portion 54a and the second step portion 54b, and each of the first extraction electrodes 71a and 71b is connected to the first shield film 8a. The positions of the first extraction electrodes 71a and 71b in the height direction are different from each other. In the present embodiment, the position of the second extraction electrode 72 in the height direction is different from the position of any of the first extraction electrodes 71a and 71b in the height direction. However, the position of the second extraction electrode 72 in the height direction may be the same as the position of any of the first extraction electrodes 71a and 71b in the height direction.

Also in the present embodiment, the same effect as that described in the fifth embodiment may be obtained.

Seventh Embodiment

Figure 18:
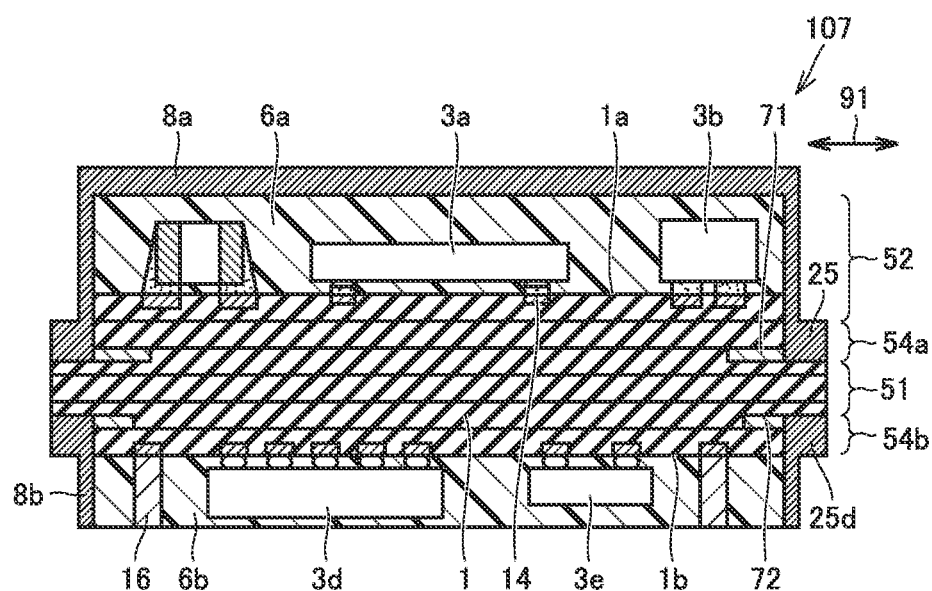
FIG. 18 is a first cross-sectional view illustrating a module according to a seventh embodiment of the present disclosure.
Figure 19:
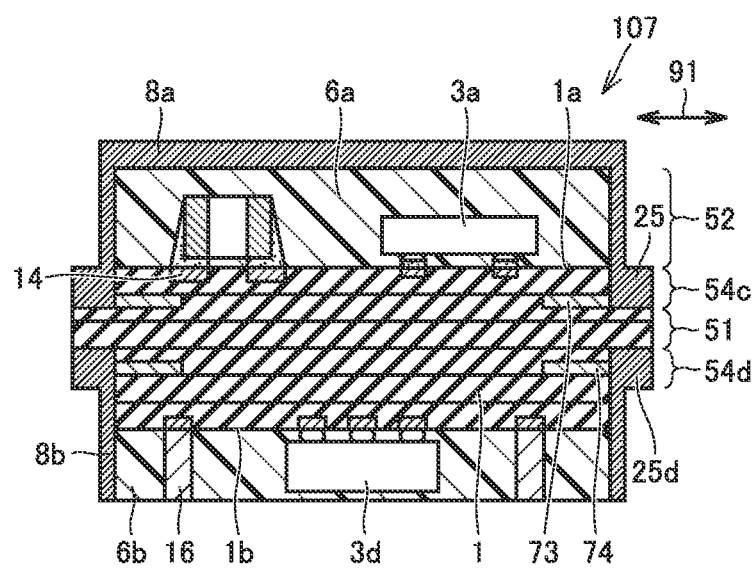
FIG. 19 is a second cross-sectional view illustrating the module according to the seventh embodiment of the present disclosure.

A module according to a seventh embodiment of the present disclosure will be described with reference to FIGS. 18 and 19. FIG. 18 is a cross-sectional view illustrating a module 107 according to the present embodiment. FIG. 19 is a cross-sectional view illustrating the module 107 taken along a plane different from that of FIG. 18 by an orientation angle of 90°. The module 107 is basically the same as the module 106 described in the sixth embodiment except the following configuration.

The module 107 includes a second shield film 8b separate from the first shield film 8a.

The substrate 1 has a second surface 1b facing opposite to the first surface 1a. The module 107 includes a second sealing resin 6b disposed to cover the second surface 1b, and a second shield film 8b that covers a part of the side surface of the substrate 1 and the side surface of the second sealing resin 6b.

The configuration of the module 107 can also be expressed as follows. The module 107 includes a substrate 1 having a first surface 1a and a second surface 1b facing opposite to the first surface 1a, a component 3a mounted on the first surface 1a as a first component, a first sealing resin 6a disposed to cover the first surface 1a and the first component, a second sealing resin 6b disposed to cover the second surface 1b, a first shield film 8a that covers at least a part of an upper surface and a side surface of the first sealing resin 6a and a side surface of the substrate 1, and a second shield film 8b that covers a part of the side surface of the substrate 1 and a side surface of the second sealing resin 6b. When viewed in a cross section taken along a plane perpendicular to the first surface 1a, the substrate 1 includes a first step portion 54a and a second step portion 54b formed closer to the second surface 1b than the first step portion 54a. The first shield film 8a covers the first step portion 54a. The second shield film 8b covers the second step portion 54b. The substrate 1 includes a first extraction electrode 71 disposed to be exposed to the first step portion 54a and a second extraction electrode 72 disposed to be exposed to the second step portion 54b. The first extraction electrode 71 is connected to the first shield film 8a. The second extraction electrode 72 is connected to the second shield film 8b. The position of the second extraction electrode 72 in the height direction is different from the position of the first extraction electrode 71 in the height direction.

As illustrated in FIG. 18, in the module 107, the depth of the position where the first extraction electrode 71 is disposed when viewed from the first surface 1a is different from the depth of the position where the second extraction electrode 72 is disposed when viewed from the second surface 1b. In the example illustrated in FIG. 18, the first extraction electrode 71 is disposed at a position separated from the first surface 1a by two insulating layers in the depth direction, whereas the second extraction electrode 72 is disposed at a position separated from the second surface 1b by one insulating layer in the depth direction. This is merely an example. For example, the depth of the position where the first extraction electrode 71 is disposed when viewed from the first surface 1a may be the same as the depth of the position where the second extraction electrode 72 is disposed when viewed from the second surface 1b.

The first shield film 8a and the second shield film 8b are separated from each other. As illustrated in FIG. 19, the substrate 1 is provided with a step portion 54c and a step portion 54d. The substrate 1 includes an extraction electrode 73 and an extraction electrode 74. The extraction electrode 73 is exposed to the step portion 54c. The extraction electrode 74 is exposed to the step portion 54d. The step portion 54c is provided with a thick portion 25. The step portion 54d is provided with a thick portion 25d. The extraction electrode 73 is connected to the thick portion 25 at the step portion 54c. The extraction electrode 74 is connected to the thick portion 25d at the step portion 54d.

Also in the present embodiment, the same effect as that described in the fifth embodiment may be obtained. In the present embodiment, since the first shield film 8a and the second shield film 8b are physically separated from each other and are electrically independent from each other, it is possible to prevent noise from propagating through the shield film, which makes it possible to improve the shielding performance.

Eighth Embodiment

Figure 20:
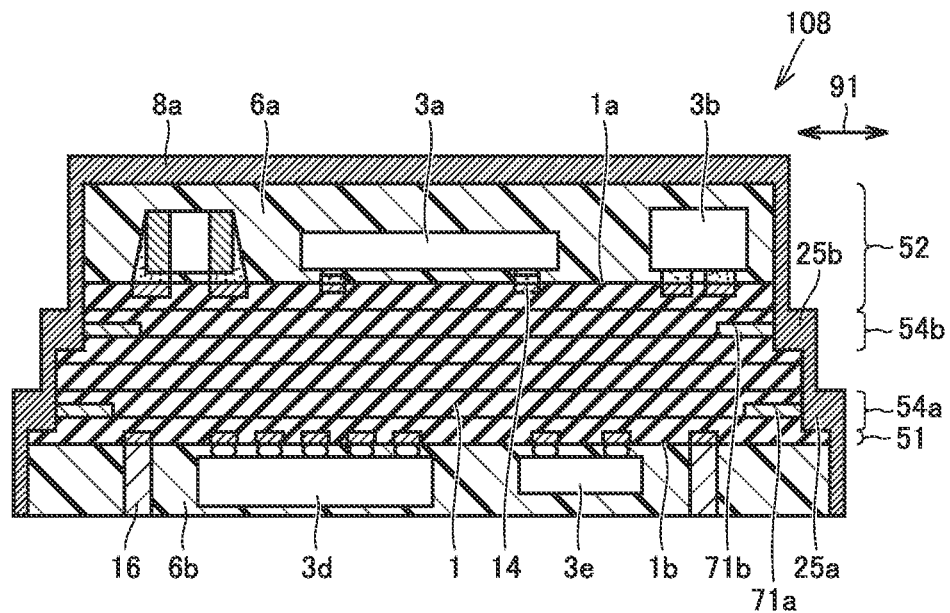
FIG. 20 is a first cross-sectional view illustrating a module according to an eighth embodiment of the present disclosure.
Figure 21:
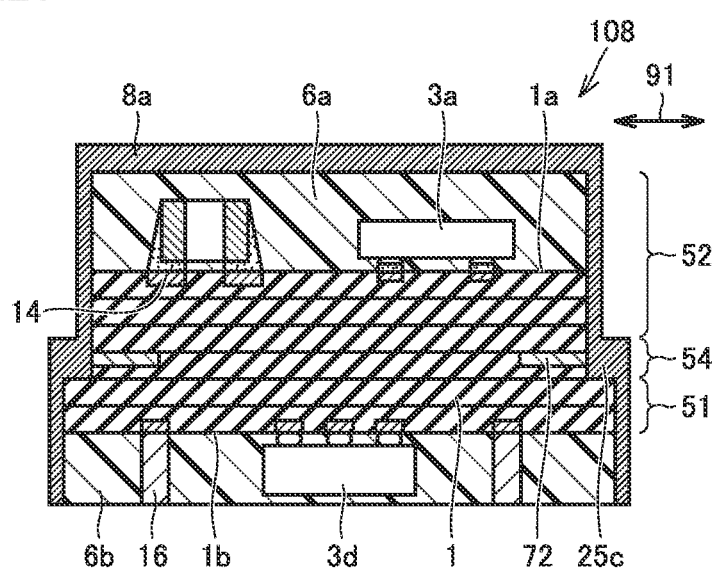
FIG. 21 is a second cross-sectional view illustrating the module according to the eighth embodiment of the present disclosure.

A module according to an eighth embodiment of the present disclosure will be described with reference to FIGS. 20 and 21. FIG. 20 is a cross-sectional view illustrating a module 108 according to the present embodiment. FIG. 21 is a cross-sectional view illustrating the module 108 taken along a plane different from that of FIG. 20 by an orientation angle of 90°. The module 108 is basically the same as the module 105 described in the fifth embodiment except the following configuration.

In the present embodiment, the substrate 1 has a plurality of step portions. In other words, the substrate 1 is provided with a first step portion 54*a* and a second step portion 54*b*. Each step portion is provided with a thick portion. In the example illustrated in FIG. 20, the first step portion 54*a* is provided with a thick portion 25*a*. The second step portion 54*b* is provided with a thick portion 25*b*. In the present embodiment, the first extraction electrodes 71*a* and 71*b* are disposed to be exposed to the side surface of the substrate 1. The thick portion 25*a* is provided at a location where the first extraction electrode 71*a* is exposed to the side surface of the substrate 1. The thick portion 25*b* is provided at a location where the first extraction electrode 71*b* is exposed to the side surface of the substrate 1.

As illustrated in FIG. 21, a thick portion 25*c* is provided so as to correspond to the second extraction electrode 72. It is apparent from the comparison of FIGS. 20 and 21 that in the double-sided mounting structure, the number of thick portions may vary on different sides in a planar view. This is merely an example. The number of thick portions may be the same in each side in a planar view.

Also in the present embodiment, the same effect as that described in the first embodiment may be obtained.

The embodiments described above may be appropriately joined together.

The embodiments disclosed herein are illustrative and non-restrictive in all respects. The scope of the present disclosure is defined by the claims, and encompasses all modifications equivalent in meaning and scope to the claims.

1: substrate; 1*a*: first surface; 1*b*: second surface; 3*a*, 3*b*, 3*c*, 3*d*, 3*e*: component; 6*a*: first sealing resin; 6*b*: second sealing resin; 8*a*: first shield film; 8*b*: second shield film; 14, 15: pad electrode; 16: columnar electrode; 20: trench; 21: cut; 23: plating film; 25, 25*a*, 25*b*, 25*c*, 25*d*: thick portion; 51: first portion; 52: second portion; 54, 54*c*, 54*d*: step portion; 54*a*: first step portion; 54*b*: second step portion; 55: inclined portion; 71, 71*a*, 71*b*: first extraction electrode; 72: second extraction electrode; 73, 74: extraction electrode; 81: first side; 82: second side; 91: arrow; 101, 102, 103, 104, 105, 106, 107, 108: module

The invention claimed is:

1. A module comprising:
a substrate having a first surface extending in a first direction and a side surface extending in a height direction, said first direction being perpendicular to said height direction;
a first component mounted on the first surface;
a first sealing resin disposed to cover the first surface and the first component; and
a first shield film covering at least a part of an upper surface and a side surface of the first sealing resin and the side surface of the substrate,
wherein the side surface of the substrate includes first and second portions, said first portion being positioned closer to the first surface of the substrate than the second portion in the height direction, wherein the first and second portions are parallel to one another, wherein the first and second portions are offset from one another in the first direction, and wherein a connecting surface of the substrate extends from the first portion to the second portion in the first direction and is oriented perpendicular to the first and second portions such that when viewed in a cross section taken along a plane perpendicular to the first surface, the substrate is provided with a step portion,
the substrate includes a first extraction electrode disposed to be exposed to the step portion,
the first extraction electrode is connected to the first shield film,
the first shield film includes one or more thick portions having a film thickness greater than a film thickness of other portions in the step portion,
the substrate has a first side and a second side,
the first extraction electrode is disposed to be exposed to the step portion at the first side,
the substrate further includes a second extraction electrode disposed to be exposed to the step portion at the second side,
a position of the second extraction electrode in the height direction is different from a position of the first extraction electrode in the height direction, and
the first extraction electrode, the second extraction electrode and the first shield film are connected to a ground potential, and
when viewed in a cross section taken along a plane perpendicular to the first surface, a side surface of a portion where the first sealing resin and the substrate are joined together includes an inclined portion where the side surface of the substrate is inclined between the first portion and the first surface.

2. The module according to claim 1, wherein
the substrate has a second surface facing opposite to the first surface,
the module further includes a second sealing resin disposed to cover the second surface and
the first shield film extends to cover a side surface of the second sealing resin.

3. The module according to claim 1, wherein
the substrate has a second surface facing opposite to the first surface,
the module further includes a second sealing resin disposed to cover the second surface, and
a second shield film disposed to cover a part of the side surface of the substrate and a side surface of the second sealing resin.

4. The module according to claim 3, wherein
the first shield film and the second shield film are separated from each other.

5. The module according to claim 1, wherein
the substrate has a second surface facing opposite to the first surface,
the module further includes a second sealing resin disposed to cover the second surface and
the first shield film extends to cover a side surface of the second sealing resin.

6. The module according to claim 1, wherein
the substrate has a second surface facing opposite to the first surface,
the module further includes a second sealing resin disposed to cover the second surface, and
a second shield film disposed to cover a part of the side surface of the substrate and a side surface of the second sealing resin.

7. The module according to claim 1, wherein the first shield film has a side surface including first and second sections that cover the first and second portions of the side surface of the substrate, respectively, wherein the first and second sections are parallel to one another, and wherein the first and second sections are offset from one another in the first direction.

8. The module according to claim 7, wherein the first section is laterally offset from the second portion in the first direction, and wherein the first section does not extend outwards beyond the second portion in the first direction.

9. The module according to claim 7, wherein an intermediate surface of the first shield film extends from the first section to the second section in the first direction.

10. The module according to claim 9, wherein the intermediate surface is oriented perpendicular to the first and second sections.

* * * * *